United States Patent
Andrews

(10) Patent No.: US 7,893,763 B2
(45) Date of Patent: Feb. 22, 2011

(54) APPARATUS AND METHOD FOR POWER ADDED EFFICIENCY OPTIMIZATION OF HIGH AMPLIFICATION APPLICATIONS

(75) Inventor: Michael S. Andrews, Escondido, CA (US)

(73) Assignee: OnQ Technology, Inc., Escondido, CA (US)

( * ) Notice: Subject to any disclaimer, the term of this patent is extended or adjusted under 35 U.S.C. 154(b) by 0 days.

(21) Appl. No.: 12/106,217

(22) Filed: Apr. 18, 2008

(65) Prior Publication Data

US 2008/0284519 A1  Nov. 20, 2008

Related U.S. Application Data

(60) Provisional application No. 60/912,450, filed on Apr. 18, 2007.

(51) Int. Cl.
*H03G 3/20* (2006.01)
(52) U.S. Cl. .......................... 330/136; 330/129
(58) Field of Classification Search .............. 330/136, 330/129, 279, 298, 207 P
See application file for complete search history.

(56) References Cited

U.S. PATENT DOCUMENTS 6,759,902 B2 *  7/2004  Kossor ...................... 330/136
7,288,988 B2 *  10/2007  Braithwaite ................ 330/149
7,466,195 B2 *  12/2008  Drogi et al. ................. 330/136

OTHER PUBLICATIONS

Dongjiang Qiao, et al, "An Intelligently Controlled RF Power Amplifier With a Reconfigurable MEMS-Varactor Tuner", appearing in IEEE Transactions on Microwave Theory and Techniquies, vol. 53, No. 3, Mar. 2005, pp. 1089-1095.

* cited by examiner

*Primary Examiner*—Henry K Choe
(74) *Attorney, Agent, or Firm*—Antonelli, Terry, Stout & Kraus, LLP.

(57) ABSTRACT

A power added efficiency optimizer apparatus is provided for measuring and monitoring input and output power of an amplifying device, and adjusting the load impedance seen by the amplifying device so that power added efficiency is maintained at optimum levels. A power added efficiency optimizing device includes a variable load impedance that can be controlled, at least one power detection device located after the load, a difference forming apparatus, and at least one coupling device. The power added efficiency optimizing device provides an ability to maintain an amplifier at peak efficiency in a dynamic way and in the presence of changing electromagnetic load conditions.

6 Claims, 7 Drawing Sheets

APPARATUS AND METHOD FOR POWER ADDED EFFICIENCY OPTIMIZATION OF HIGH AMPLIFICATION APPLICATIONS

CROSS REFERENCE TO RELATED APPLICATION

This application claims priority from U.S. application Ser. No. 60/912,450, filed Apr. 18, 2007, the contents of which are incorporated herein by reference.

BACKGROUND OF THE INVENTION

1. Technical Field

The present invention relates to high power amplification systems and, more particularly, to a power added efficiency optimizer capable of reducing thermal run away.

2. Description of the Related Art

In a high-power, high-frequency, and broad band amplifier application, thermal run away is one of the most difficult problems of the design. The thermal run away comes from self heating of a solid state device when used under amplifying conditions. Conventional solutions to this problem often involve development of adequate heat sinks from bulk conductive material to support the thermal conditions under which the device must operate. Heat is generated in an amplifier due to inefficient transfer of power to the output stage. The output stage can be an antenna directly, a circulator, diplexer, another amplifier, etc. Whatever is not converted by the transducer operation of the amplifier into transferred power, which for a communications system is DC to radio frequency (RF) power, is directly transferred to heat and wasted.

A natural consequence of designing linearization electronics for amplifiers has been somewhat mitigation of inefficiency. In other words, efficiency improvement has been a consequence of applying a vast array of linearization techniques to power amplifiers. It has been necessary to apply such techniques because of the high degree of nonlinearity underlying transistors exhibit especially for power driving amplifier stages. As a by-product of such techniques, efficiency is improved, but thermal run away has remained unaffected.

Accordingly, there exists a need for improving high power amplifier applications.

There also exists a need for reducing the thermal run away associated with high amplification conditions.

SUMMARY OF THE INVENTION

It is therefore one feature and advantage of the present invention to address at least some of the shortcomings of the prior art in eliminating thermal run away.

It is another optional feature and advantage of the present invention to provide an apparatus for improving high power amplifier applications.

It is yet another optional feature and advantage of the present invention to provide an apparatus capable of reducing the thermal run away associated with high amplification conditions.

The foregoing, and various other needs, are addressed, at least in part, by the present invention, wherein a power added efficiency tuner is used to dynamically monitor and control an amplifier output in order to maximize transfer efficiency from the input.

According to one embodiment of the invention, a power added efficiency optimizer apparatus is provided to maximize transfer efficiency for an amplified input signal. The apparatus includes a first coupling device that receives an input signal from an external source. The first coupling includes a first main path output and a first coupling branch. The first coupling device is constructed such that the first main path carries a large percentage of the input signal relative to the first coupling branch. A second coupling device receives an amplified input signal, and includes a second main path and a second coupling branch. The second coupling device is also configured such that it carries a large percentage of the amplified input signal relative to the second coupling branch. The apparatus also includes a variable load impedance for generating an impedance matched signal based on the amplified input signal, and a difference forming apparatus for generating a difference signal based on the input signal from the first coupling branch and the impedance matched signal. An efficiency tuner is also provided to process the output difference signal, and determine an optimum tuning command for the variable load impedance.

There has thus been outlined, rather broadly, the more important features of the invention and several, but not all, embodiments in order that the detailed description thereof that follows may be better understood, and in order that the present contribution to the art may be better appreciated. There are, of course, additional features of the invention that will be described hereinafter and which will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein are for the purpose of description and should not be regarded as limiting.

As such, those skilled in the art will appreciate that the conception, upon which this disclosure is based, may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

Further, the purpose of the foregoing abstract is to enable the U.S. Patent and Trademark Office and the public generally, and especially the scientists, engineers and practitioners in the art who are not familiar with patent or legal terms or phraseology, to determine quickly from a cursory inspection the nature and essence of the technical disclosure of the application. The abstract is neither intended to define the invention of the application, which is measured by the claims, nor is it intended to be limiting as to the scope of the invention in any way.

These, together with other objects of the invention, along with the various features of novelty which characterize the invention, are pointed out with particularity in the claims annexed to and forming a part of this disclosure. For a better understanding of the invention, its operating advantages and the specific objects attained by its uses, reference should be

DETAILED DESCRIPTION OF THE INVENTION

Reference now will be made in detail to the presently preferred embodiments of the invention. Such embodiments are provided by way of explanation of the invention, which is not intended to be limited thereto. In fact, those of ordinary skill in the art may appreciate upon reading the present specification and viewing the present drawings that various modifications and variations can be made.

For example, features illustrated or described as part of one embodiment can be used on other embodiments to yield a still further embodiment. Additionally, certain features may be interchanged with similar devices or features not mentioned yet which perform the same or similar functions. It is therefore intended that such modifications and variations are included within the totality of the present invention.

Figure 1:
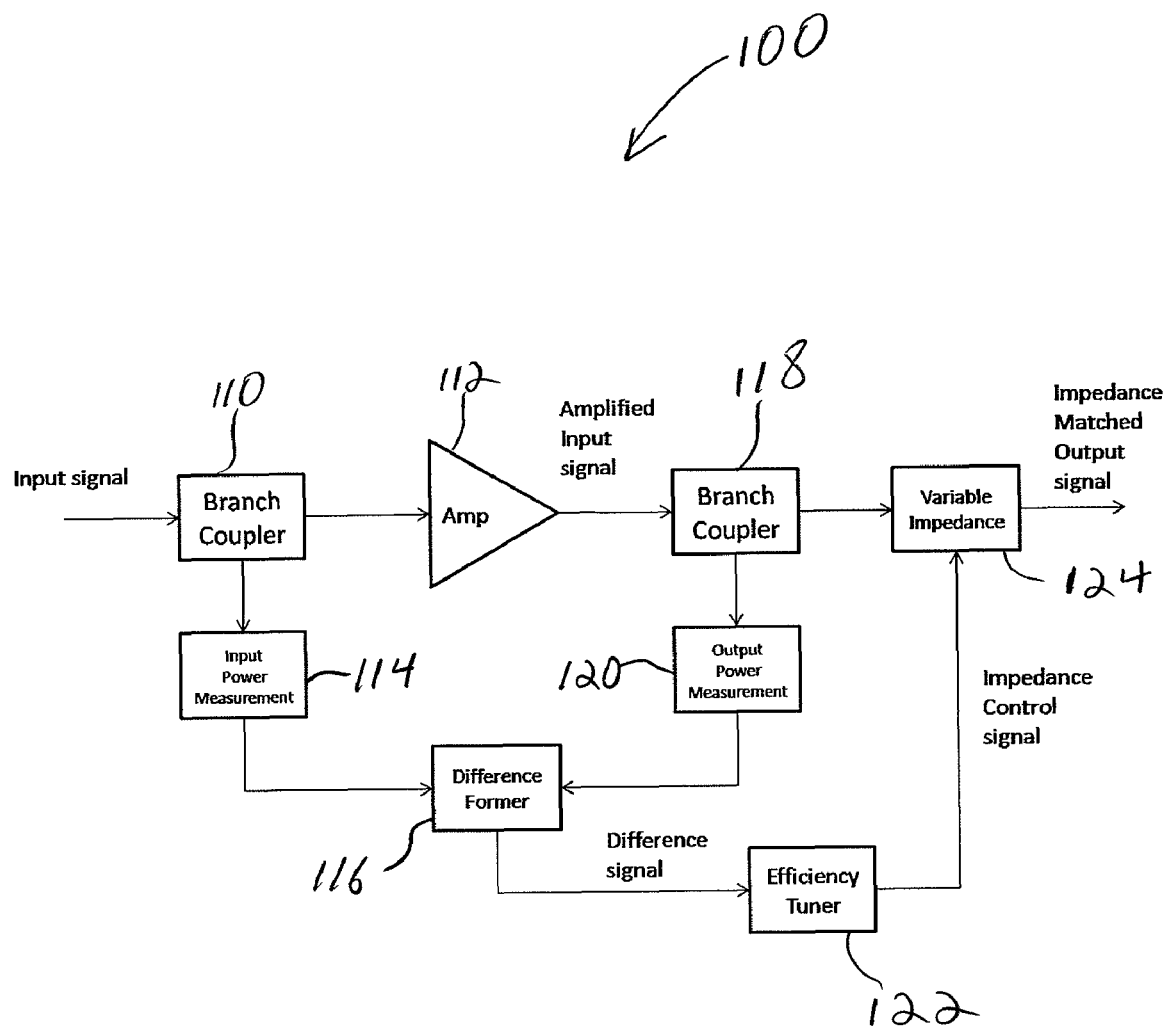
FIG. 1 is a block diagram illustrating a power added efficiency optimizing apparatus according to an exemplary embodiment of the present invention.

Referring to the drawings, and initially to FIG. 1, a power added efficiency apparatus 100 for improving transfer efficiency is illustrated. As shown in FIG. 1, an input signal generated from an external electronic signal source is input to branch coupling device 110. The branch coupling device 110 reproduces most of the input signal at the output left-to-right branch, while it also provides an attenuated version of the input signal to the downward branch. The left-to-right branch is fed to a power amplifier 112, while the downward branch is fed into a power measurement device 114. The power measurement device 114 estimates the input power to the amplifier from this signal supplies the estimate to one input of a subtraction circuit or differencing apparatus 116.

The amplifier 112 produces an amplified signal that is passed into a second branch coupler 118 which reproduces most of the input signal at the output left-to-right branch, while it also provides an attenuated version of the input signal to the downward branch, as with the first branch coupler 110. The downward branch of the second branch coupler 118 is fed into a second power measurement device 120. The second power measurement device 120 estimates the output power of the amplifier 112 using the amplified signal as a basis for measurement. The measured output power is supplied to a second input of the subtraction circuit or differencing apparatus 116. The output from the differencing apparatus 116 is then fed into an efficiency tuner 122. The efficiency tuner 122 processes the output of the differencing apparatus in order to determine how the impedance should be set within a variable impedance apparatus 124 so that maximum power conversion efficiency is achieved by the apparatus 100. The branch couplers 110, 118 of the present invention are configured such that the left-to-right branch (as shown in the figures) carry a large percentage of the signal that is input relative to the downward branch. According to various embodiments of the invention, the left-to-right branch of the branch couplers 110, 118 carry more than 90% of the signal, preferably more than 95%, and most preferably more than 99%.

Those skilled in the art will appreciate that a number of possible techniques exist for implementing the branch couplers 110, 118, including use of simple parallel strip-line separated by a distance, antennas, or coaxial cable with attenuator and splitter to name just a few. The power measurement devices 110, 120 can be implemented in a variety of ways from use of a simple envelope detection (AM demodulator) method, to using a logarithmic amplifier, to implementation of an received signal strength indicator function (RSSI) as has been done within almost every modern cellular phone. The differencing apparatus 116 can be implemented with an op-amp configured in differential mode, a comparator system, or performed digitally by digitizing the power measurement estimates and digitally computing the subtraction with a digital computing device (not shown). The efficiency tuner apparatus 122 and its operation can be implemented in analog or digital or a combination of both techniques. Finally, the variable impedance apparatus 124 can be implemented with a number of methods, including but not limited to; a PIN diode with a varactor diode, a micro-electromechanical (MEMs) device constructed with switched-in/switched-out parallel capacitors, a thin-film material with variable impedance properties depending on electrical deformation, and a combination of variable inductance and variable capacitance devices. Furthermore, the first branch coupler 110 and the power measurement device 114 may be eliminated if the input signal power is known a priori to a degree of certainty. These additional elements are claimed for completeness to illustrate that the input signal power must be known to a degree of certainty for the optimum efficiency to be achieved by the apparatus 100.

Figure 2:
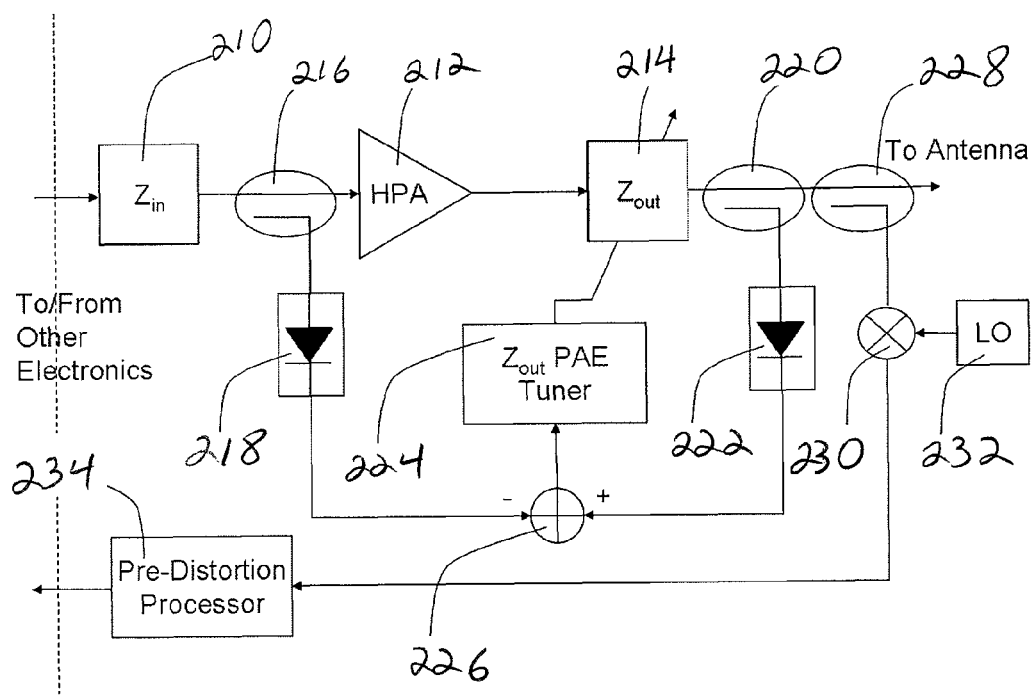
FIG. 2 illustrates the details of a power added efficiency optimizing apparatus according to an exemplary embodiment of the present invention.

FIG. 2 illustrates the details of a power added efficiency optimizing apparatus in accordance with one or more embodiments of the present invention. According to various embodiments of the president invention, it is desirable that the transistor for the power stage be inductive for a standard load of 50 ohms. This will mean that the match for optimum power added efficiency (PAE) may be added with capacitive tending alone. Thus a high power variable capacitance device, such as a varactor tunable diode, and a variable attenuator is quite sufficient for use to visit all points in the matching quarter plane of the normalized Smith chart for optimal power added efficiency. Accordingly, the PAE optimizer circuit, or efficiency tuner, is separate from the high power amplifier (HPA) circuitry.

As can be appreciated, a high power amplifier (HPA) creates greater power conversion problems, because more power is wasted as heat for a given amount of inefficiency below 100%. While the present description discloses the use of an HPA, this should not limit the scope of the present invention. More particularly, the present invention can be applied to any signal conversion (or transformation) where signal power is transformed, as a transducer, from one type to another, as in the case of DC power to RF power conversion performed by a power amplifier, and especially as performed by a high power amplifier (HPA).

As illustrated in FIG. 2, an input signal from other radio frequency electronics reaches the input matching circuit, Zin, 210, and is then received by a high power amplifier, 212, where it is amplified, producing an amplified signal. The input matching circuit 210 has been observed by the inventor in practice to not be nearly as critical in achieving overall power added efficiency (or power transfer efficiency) as the output matching circuit. Therefore, for the present invention, it will not be made adjustable, although it could be made adjustable for slightly better improvements over the variable impedance as a tunable load only.

A branch coupler 216, receives a calibrated and somewhat attenuated version of the signal supplied to the HPA (high power amplifier), 212. A tunable load 214, that involves both a parallel and resistive reactance component is adjusted with commands or voltages or currents or any other means imaginable that is physical by the efficiency tuner (or PAE) 224. The efficiency tuner 224, has a preferred embodiment that is implemented using digital techniques for stability and control, but may be implemented with analog techniques or a combination of analog and digital techniques as well. Even so, it is possible to construct such a circuit with purely analog electronics. This is possible to do digitally because envelope rates of the power measured through the power detectors 218 and 222, received from the branch couplers 216 and 220, are typically much, much less than the carrier frequencies on which the modulated signals ride if the power detectors are implemented appropriately—usually with some form of envelope demodulation method or using bandpass filtering followed by a low pass filter. The power detectors 218, 222 provide an estimate of the power between the output and input ports of the HPA. These may be subtracted from one another by a difference forming apparatus 226 for the PAE estimate directly, divided by the DC power, which is fixed and known, and converted to percent, which is given in equation (1) below.

$$PAE = \frac{P_{OUT} - P_{IN}}{P_{dc}}\% \quad (1)$$

Also, it is often desirable to access the final output through either optional branch coupler 228, or another feed from coupling device 220. Such a signal would be downconverted by a mixer 230, using a local oscillator (or LO) 232, matched to the upconversion frequency, supplied to the other rf electronics within the system. It is conceivable that a pre-distortion processor 234 could then be used to maintain linear final linear output of the HPA, a desirable quality.

Any algorithm used by the efficiency tuner 224 must be cautiously aware of problems like feedback stability, and it must maintain very fine granularity, if necessary, which could even require more than 16 bits of digital precision (if implemented digitally), although it is imaginable that fewer bits of precision or more bits of precision could be used in various design scenarios. Also, the PAE tuner must converge on a solution rapidly. One exemplary scheme uses the Z domain (digitized complex number plane) and is derived from a system function like the one presented below in equation (2).

$$H(z) = \frac{r\sin(\omega_0)z^{-1}}{1 - r\cos(\omega_0)z^{-1} + r^2 z^{-2}} \quad (2)$$

In such a function, the poles and zeros representing the various discrete tune positions of the variable impedance matching circuit are evenly distributed in the Z-plane when quantized. For a given quantization of B bits, the Z-plane mapping is uniform in that quantization. We need a reasonable density of points near the edge of the mapping equivalent Smith chart and this function will provide that, when quantized to B bits. Once the PAE tuner 224 is set such that the tunable output matching circuit 214 and is thus operating in the vicinity of the ideal matching condition, a closer match can next be obtained by increasing precision and searching only in the region of the increased precision.

Figure 3:
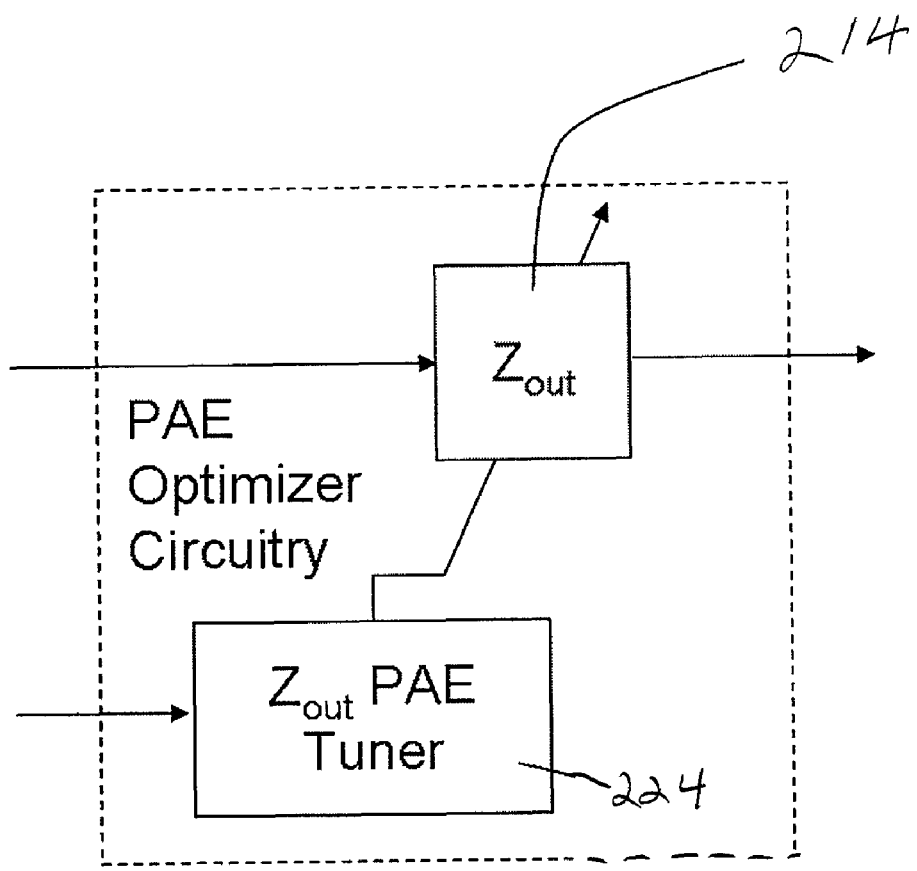
FIG. 3 is a block diagram illustrating a power added efficiency tuner apparatus in accordance with one or more embodiments of the present invention.
Figure 4:
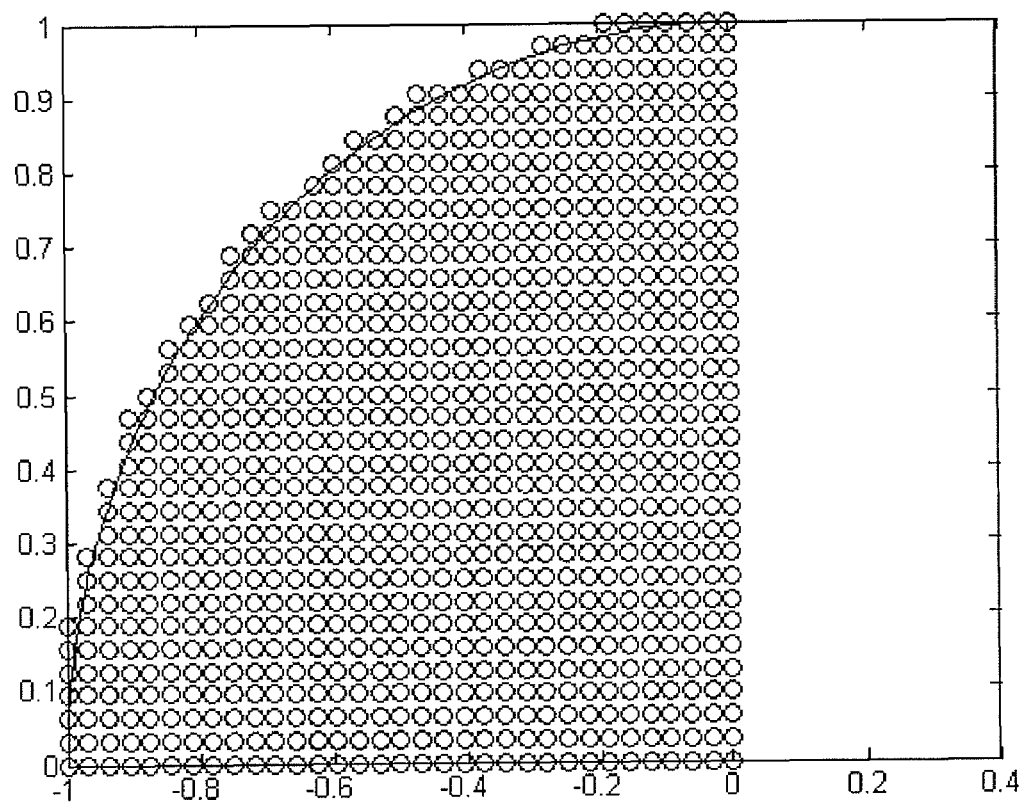
FIG. 4 is a discrete mapping of a normalized Smith Chart illustrating possible locations of Z-domain numbers.

The adjustable aspects of the preferred embodiment are shown in FIG. 3, where the PAE tuner device, 8, and the adjustable output matching circuit, 3, are displayed. FIG. 4 shows the possible locations of Z-plane numbers, which is identically the normalized impedance value, achievable with 5 bits of precision.

Continuous maintenance of the output matching impedance is maintained by using feedback techniques, i.e. a closed loop control system. Such feedback approaches may be implemented in a variety of possible techniques. Some example techniques are the least mean square (LMS) gradient descent algorithm, or the one step prediction algorithm. In the LMS gradient descent algorithm, the current impedance tuning position of the variable impedance device is adjusted based on an adaptively filtered version of previous tuning positions. The adaptation is directed by an error criterion from a known desired response. In the present invention and in the preferred embodiment, this error criterion is formed as the difference between a target operating efficiency as specified for the particular amplifier class of operation and that measured through the PAE measurement from equation 1. While LMS search algorithms are usually more easily implemented and tailored with digital techniques, it is also quite possible to construct a purely analog form of the least mean squared gradient descent algorithm.

Figure 5:
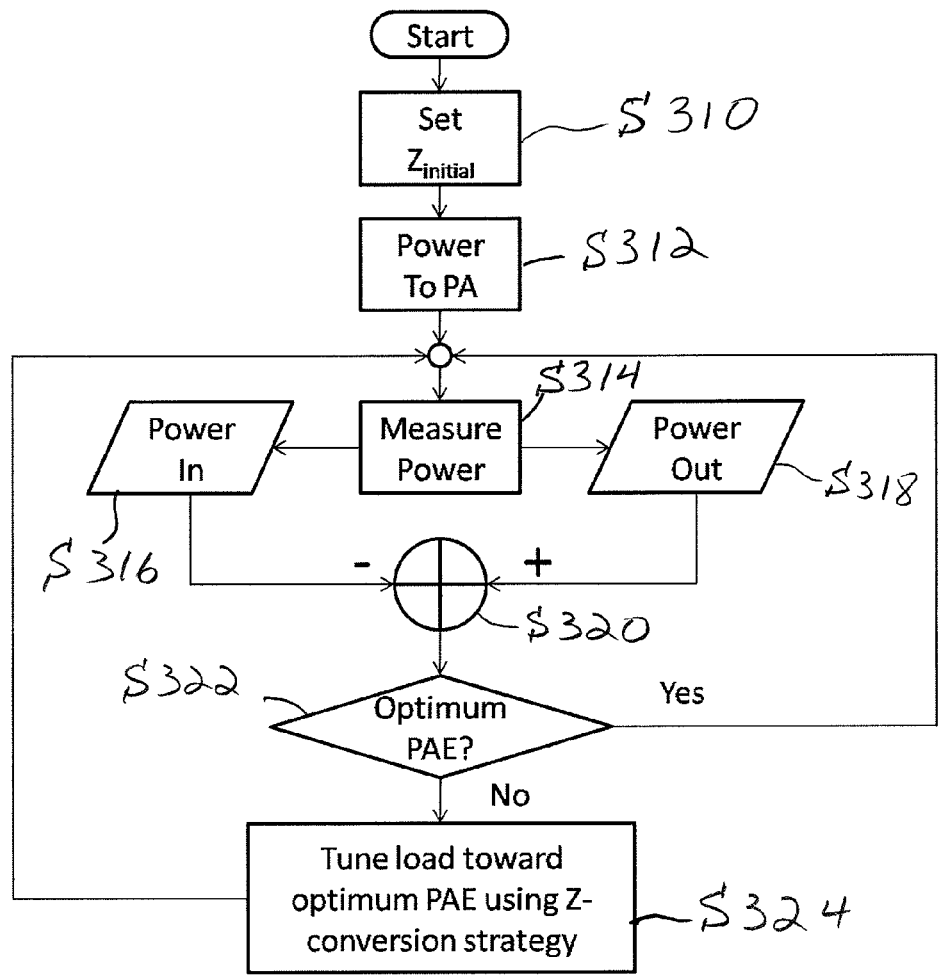
FIG. 5 is a flowchart illustrating the steps performed to optimize power transfer efficiency according to one or more embodiments of the present invention.

FIG. 5 is a flowchart illustrating the steps performed to optimize power transfer efficiency according to one or more embodiments of the present invention. An initial condition is set for the HPA output matching impedance at step S310. As can be appreciated, the output power will likely not be large when the HPA is first turned on—in other words, the variable output matching circuit is initially set for reasonable attenuation factors before the HPA is turned on. The HPA is then turned on at step S312. A good starting position is in the middle of one of the Smith chart quadrants were the optimum match can be reached by moving with variable capacitance and attenuation of the tunable load 214.

Figure 6:
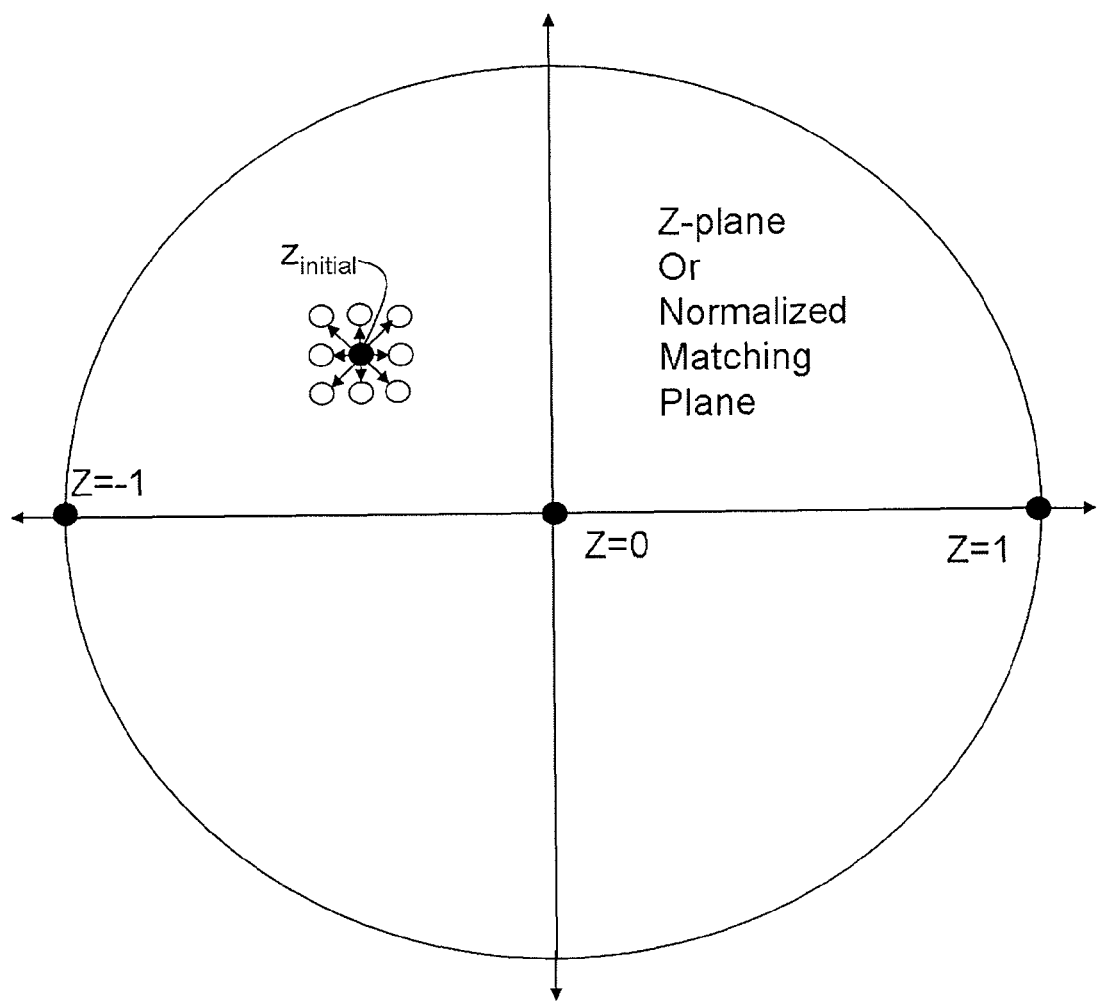
FIG. 6 illustrates an exemplary search area for optimizing impedance for power added efficiency.

Referring additionally to FIG. 6, an exemplary starting position is illustrated. The system functions are stepped so that the nearest eight neighbors are tried in the given precision. This is shown at step S314. The input signal power and amplified signal power are re-measured at S316 and S318. The difference between amplified signal power measured and input signal power measured is determined at step S320. At step S322, it is determined if the optimum PAE has been reached. If so, then control returns to step S314. If the optimum PAE has not been reached, then at step S324, the impedance is stepped in the direction which maximizes power added efficiency until done utilizing a search algorithm such as the LMS gradient descent algorithm. This typically provides the best guess and best time approach to converge on the power added efficiency. As can be appreciated, there are numerous techniques and methodologies that can be implemented to achieve optimum system operating efficiency. Furthermore, such techniques, including the algorithm illustrated in FIG. 5, can also be implemented exclusively in analog electronics or a combination of digital and analog electronics or in a combination of digital and analog electronics involving a computer in conjunction with computer software.

Conversion to and from the complex representation of FIG. 6 and a physical varactor diode and attenuation setting for impedance correction can be accomplished in various ways. For example, the value may be looked up in a calibration table or computed directly and such look-up or computation may rely on the known previous correction value or several previously known correction values to update the current correction value. The correction value is then calibrated to voltage or any other physical tuning parameter, to achieve the appropriate value for representing some complex reactance X (composed of a complex number $Xr+j*Xi$ where $Xr$ is the real part and $Xi$ is the imaginary part), which can then be input to the tunable load 214. This can provide good and reasonable tuning of output load match for the HPA to maintain peak power added efficiency.

Figure 7:
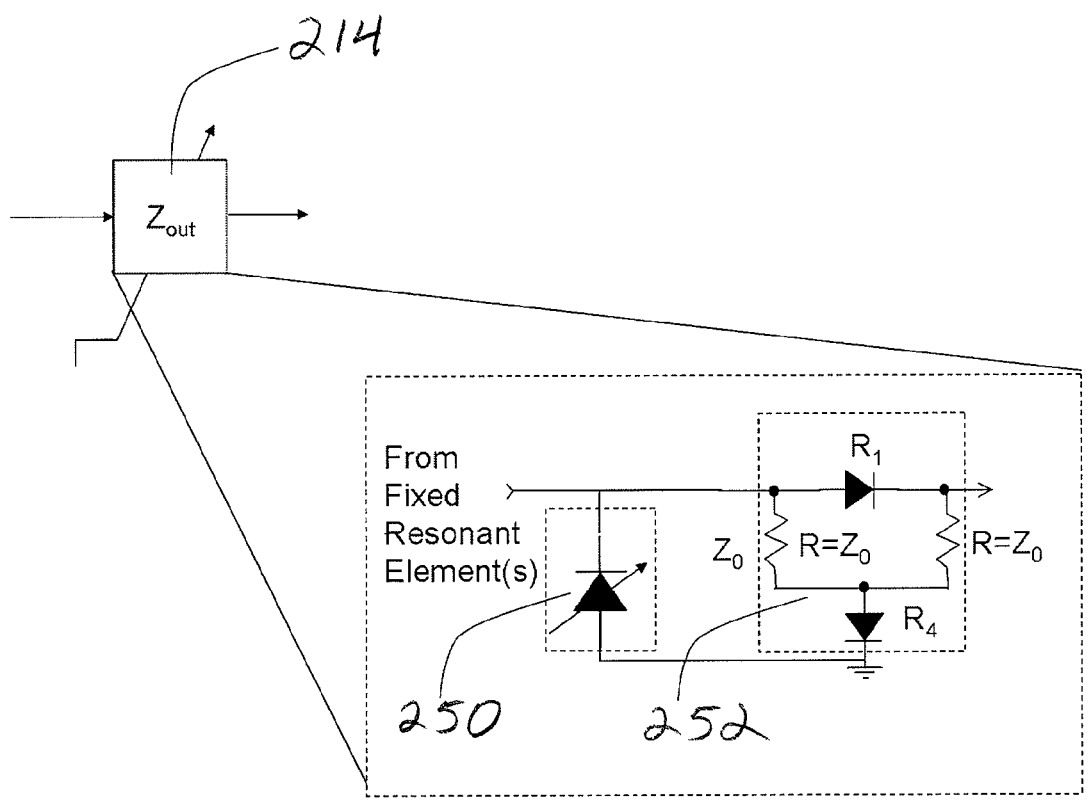
FIG. 7 is a circuit diagram illustrating a tunable impedance matching circuit in accordance with an exemplary embodiment of the present invention.

FIG. 7 is a circuit diagram illustrating a tunable impedance matching circuit in accordance with one or more embodiments of the present invention. The tunable load 214 is first adjusted through a variable capacitance diode 250, or varactor. Next, it is adjusted by a variable attenuator 252 using PIN diodes R1 and R4. This allows reactive and resistive tuning to hit most, if not all, areas of interest in the Smith chart, or normalized Z-plane, as previously illustrated. It is conceivable that multiple configurations of final stage output matching impedance tuning circuits are possible, some with multiple varactors and multiple attenuators and even tuning inductors. Other possible arrangements for the variable impedance include, but are not limited to, MEMs devices, thin-film methods, quasi-optical methods, optoelectronic techniques, and even power combiners with phase shift action or in phase shift networks or even in filtering networks. It is conceivable, that ancillary directional information could also be provided within the difference signal, (item 226 from FIG. 2), although it is not shown in this preferred embodiment. Another common circuit control mechanism that is deployed with power amplifiers is a pre-distortion circuit control algorithm. Such an algorithm would likely work by examining the output of the entire chain, including the tunable output matching impedance 214, and making parameter adjustments that would be fed back to the input prior to the input port of the amplifying device.

Depending on the specific embodiment, it can be assumed that the power out in the detectors will well approximate power at the fundamental frequency without resorting to the additional isolation filtering for center frequency power and the output branch coupler 220, the more accuracy the effective load capacitance, CL, (represented effectively by device 250 in FIG. 7) may require a second order match and two varactor diodes at the output rather than a first order where a single varactor diode was shown in FIG. 7. Those skilled in the art will appreciate that numerous circuits and methods can be used to implement the variable impedance matching circuit in addition to the one shown in FIG. 7.

What has been described is a novel apparatus capable of continuously monitoring and adjusting a circuit or circuitry consisting of a variable load impedance to optimize the power added efficiently (PAE) of an amplifying device, such as a high power amplifier (HPA) circuit. The present invention is particularly relevant with higher power transferring mechanisms due to the amount of wasted power as heat is much more significant in these types of devices. Without such circuitry, it is also necessary to carefully tune a power amplifier for an application and then use some form of power control stepping, such as a PIN diode-based step attenuator, to present the appropriate power level at the output. Such methods can also be very wasteful of energy. The present invention improves on such techniques by providing automatic output tuning so that the efficiency stays at or very near absolute peak operating conditions throughout the various operational scenarios and lifetime of the particular device (or devices) that is being used as the basis for the high power amplifier design. Furthermore, this peak operating efficiency is maintained dynamically so that transducer conditions are always ideally matched for any internal or external environmental condition seen by the transducer (amplifier or transformer). In a typical use scenario, and as discussed in the preferred embodiment, the particular device is usually a transistor or several transistors in an appropriate circuit configuration. At least one advantage of the present invention over current systems is its ability to maintain an amplifier at peak efficiency in a dynamic way and in the presence of changing electromagnetic load conditions. Changing electromagnetic load conditions is more the norm rather than static conditions in any practical system deploying power amplifying systems.

Furthermore, the variable impedance apparatus of the present invention can be adjusted in the best estimated direction for continuously improving or maintaining efficiency according to a given impedance mapping function or through a variety of other means, including but not limited to use of a gradient search technique, simple value pair stepping, quantized nearest 8-neighbor search, or through implementing a Hankel search technique, whereby, normalized Z impedance is appropriately transformed into physical apparatus tuning commands for said variable impedance apparatus and thus overall efficiency is achieved and maintained by the system.

In the present invention an apparatus is described that provides a unique capability to allow a solid state solution to be used for certain high power amplifier applications, but this solution is also widely applicable to many other types of signal transformations where energy or power is converted from one form to another, as is the case of specifically with power amplifiers that convert DC power into RF power for transmission of signals over the airwaves. Another example would be in the case of DC conversion to AC power for a number of industrial applications like power transfer to electric motors that operate with AC current rather than with DC current. It may also be necessary to provide maximum power transfer through an attenuator or through other passive networks and the present invention can also be used for that purpose.

The key to simultaneously preventing thermal run away and allowing the maximum power to be transferred at RF frequencies, is to maintain a high efficiency operation of the amplifier device within the power amplifier circuitry directly. Power amplifiers are typically constructed out of various semiconductor materials as transistors. Materials such as Gallium Arsenide (GaAs), CMOS, Silicon Germanium (SiGe) and Gallium Nitride (GaN) are used for the construction of such transistor amplifiers in solid state. Amplifiers also operate in many classes, such as Class A, Class B, Class C, Class AB, Class D, Class E and Class F. Some classes of operation, like F class has the advantage that it can be made with very high power added efficiency or PAE than other more linear classes (A, B, and AB). While there are other amplifiers that can also provide high efficiency, many amplifiers in various configurations do not allow a practical means for tuning both center frequency and PAE. While a tuner for center frequency of operation (or center band of operation) is an old idea and not novel in any way, a power added efficiency (PAE) tuner is quite novel.

The many features and advantages of the invention are apparent from the detailed specification, and thus, it is intended by the appended claims to cover all such features and advantages of the invention which fall within the true spirit and scope of the invention. Further, since numerous modifications and variations will readily occur to those skilled in the art, it is not desired to limit the invention to the exact construction and operation illustrated and described, and accordingly, all suitable modifications and equivalents may be resorted to, falling within the scope of the invention.

What is claimed is:

1. A power added efficiency optimizer apparatus comprising:
   a first coupling device for receiving an input signal from an external source, said first coupling including a first main path and a first coupling branch, said first main path carrying a large percentage of the input signal relative to the first coupling branch;
   a second coupling device for receiving an amplified input signal, said second coupling device including a second main path and a second coupling branch, said second main path carrying a large percentage of the amplified input signal relative to the second coupling branch;
   a variable load impedance for generating an impedance matched signal based on the amplified input signal;
   a difference forming apparatus for generating a difference signal based on the input signal from the first coupling branch and the impedance matched signal; and
   an efficiency tuner for processing said output difference signal, and determining an optimum tuning command for said variable load impedance;
   wherein said error forming apparatus provides feedback to said power added efficiency optimizing apparatus through said coupling devices and said power detection devices, and
   wherein maximum transfer efficiency is achieved for the amplified input signal.

2. The power added efficiency optimizer apparatus of claim 1 wherein the input signal is amplified by an amplifying device contains one or more individual amplifying elements.

3. The power added efficiency optimizer apparatus of claim 1 wherein the input signal is amplified by an amplifying device is configurable into any single or plural combination of amplifying classes of operation selected from the group consisting of Class A, Class B, Class AB, Class C, Class D, Class E, and Class F.

4. The power added efficiency optimizer apparatus of claim 1 wherein said variable load impedance includes means for controlling the impedance for optimum power transfer from an amplifying device.

5. A method of optimizing the power transfer efficiency of an amplifying apparatus, comprising the steps:
   initializing a normalized impedance representation to a predetermined position on a normalized Smith chart;
   powering the amplifying apparatus so that input signals are amplified;
   measuring power from input signal source using a first coupling device carrying a smaller portion of the input signal source;
   measuring power of an amplified signal source using a second coupling branch carrying a smaller portion of amplified input signal source;
   forming a difference signal between measured power of the input signal source and measured power of the amplified signal source;
   determining if the optimum efficiency has been reached and outputting a decision result to determine if additional variable impedance adjustments are needed;
   providing feedback to the power added efficiency optimizing apparatus through the coupling devices and said power detection devices; and
   adjusting the variable impedance apparatus in a best estimated direction for continuously improving or maintaining efficiency according to a given impedance mapping function;
   whereby a normalized Z impedance is transformed into tuning commands for the variable impedance apparatus.

6. The method of claim 5 further comprising a step of variably controlling the load impedance to optimize power transfer from said amplifying device.

* * * * *